(12) United States Patent
Chao et al.

(10) Patent No.: US 6,748,549 B1
(45) Date of Patent: Jun. 8, 2004

(54) CLOCKING AN I/O BUFFER, HAVING A SELECTABLE PHASE DIFFERENCE FROM THE SYSTEM CLOCK, TO AND FROM A REMOTE I/O BUFFER CLOCKED IN PHASE WITH THE SYSTEM CLOCK

(75) Inventors: Chi-Yeu Chao, Portland, OR (US);
Chee How Lim, Hillsboro, OR (US);
Keng L. Wong, Portland, OR (US);
Songmin Kim, Beaverton, OR (US);
Gregory F. Taylor, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 596 days.

(21) Appl. No.: 09/604,049

(22) Filed: Jun. 26, 2000

(51) Int. Cl.[7] .............................. G06F 1/04; G06F 7/00
(52) U.S. Cl. ...................... 713/401; 713/503; 365/201; 365/233
(58) Field of Search ................... 713/401, 503; 365/201, 233

(56) References Cited

U.S. PATENT DOCUMENTS

| | | | | |
|---|---|---|---|---|
| 5,118,975 A | * | 6/1992 | Hillis et al. .................. | 327/158 |
| 5,446,867 A | * | 8/1995 | Young et al. ................ | 713/503 |
| 5,787,488 A | * | 7/1998 | Garde ......................... | 711/169 |
| 5,978,929 A | * | 11/1999 | Covino et al. .............. | 713/503 |
| 5,982,238 A | | 11/1999 | Söderquist | |
| 6,144,239 A | * | 11/2000 | Yonemori et al. .......... | 327/158 |
| 6,194,930 B1 | * | 2/2001 | Matsuzaki et al. ......... | 327/156 |
| 6,236,695 B1 | * | 5/2001 | Taylor ........................ | 375/372 |

FOREIGN PATENT DOCUMENTS

| | | |
|---|---|---|
| JP | 11-110066 | 4/1999 |
| WO | WO-99-55000 | * 10/1999 |

OTHER PUBLICATIONS

Clock Aligners, http://www.ek.isy.liu.se/courses/tsek35/files2002/Seminar27.pdf, pp. 1–9.*
PCT International Search Report for PCT/US01/18754, May 30, 2002.
Sidiropoulos et al., "A Semidigital Dual Delay–Locked Loop", *IEEE Journal of Solid–State Circuits,* vol. 32, No. 11, pp. 1683–1692 (Nov. 1997).

* cited by examiner

*Primary Examiner*—Thomas Lee
*Assistant Examiner*—Michael Nieves
(74) *Attorney, Agent, or Firm*—Blakely, Sokoloff, Taylor & Zafman LLP

(57) ABSTRACT

Input/output (I/O) clock phase adjustment circuitry for use with I/O buffer circuitry of an integrated circuit chip. In one embodiment, an integrated circuit chip includes a phase adjustment circuit coupled to receive a system clock. The phase adjustment circuit generates an I/O clock coupled to be received by an I/O buffer circuit of an integrated circuit chip for I/O data transfers in a system. The phase adjustment circuit includes a phase locked loop (PLL) circuit coupled to receive the system clock through a first delay circuit. The I/O clock generated by the PLL circuit is received through a second delay circuit at a feedback clock input of the PLL circuit. The first and second delay circuits are used to control the phase of the I/O clock generated by the PLL circuit relative to the system clock. In one embodiment, a third delay circuit is included in an I/O data path of the I/O buffer circuit of the integrated circuit. The third delay circuit enables input and output data transmissions from the integrated circuit to be clocked, in effect, out of phase with the I/O clock generated by phase adjustment circuit.

29 Claims, 12 Drawing Sheets

CLOCKING AN I/O BUFFER, HAVING A SELECTABLE PHASE DIFFERENCE FROM THE SYSTEM CLOCK, TO AND FROM A REMOTE I/O BUFFER CLOCKED IN PHASE WITH THE SYSTEM CLOCK

BACKGROUND OF THE INVENTION

1. Field of the Invention

The present invention relates generally to the field integrated circuits and, more specifically, the present invention relates to input/output (I/O) between integrated circuit chips.

2. Background Information

Currently, I/O timing tests of integrated circuit chips, such as central processing units (CPUs), are performed using testers. By using a carefully calibrated multi-channel tester, one can measure the I/O timing for all pins of a chip, where the testers and the on chip phase locked loop (PLL) circuits share the same clock. The specified I/O timings are acquired by exercising different "worst-case" patterns, which are programmed during the tester setup. Furthermore, the tester environment is designed to mimic "real world" system situations whenever possible.

There are several drawbacks to measuring I/O timings in the tester environment. In order to get very accurate readings, all tester channels require extremely tight timing and careful calibration, resulting in significant tester costs. Even then, a guard-band must be added to the measured timings to help guarantee specification numbers. This is to account for the uncertainties of strobe edges and clock skew introduced by the testers. The added guard-band in the specification numbers result in more stringent requirements for both circuit designers and system designers in order to reduce the number of unqualified defects.

Another problem associated with guard-band is that additional guard-band must be added to account for the difference between the tester and the real system environment because the measurements from the testers may not emulate the real system behavior effect on the I/O timing. Thus, the circuit designers, in many instances are burdened with the additional challenges stemming from the tester requirements.

When integrated circuit chips such as a CPUs fail I/O timing tests, the parts are typically discarded. In many instances, all other functionality of the chips that fail the I/O timing tests are within the specification requirements. In addition, it has been observed that in many instances, a significant portion of the chips that fail I/O timing tests fail by a relatively small margin.

BRIEF DESCRIPTION OF THE DRAWINGS

The present invention is illustrated by way of example and not limitation in the accompanying figures.

DETAILED DESCRIPTION

Figure 1:
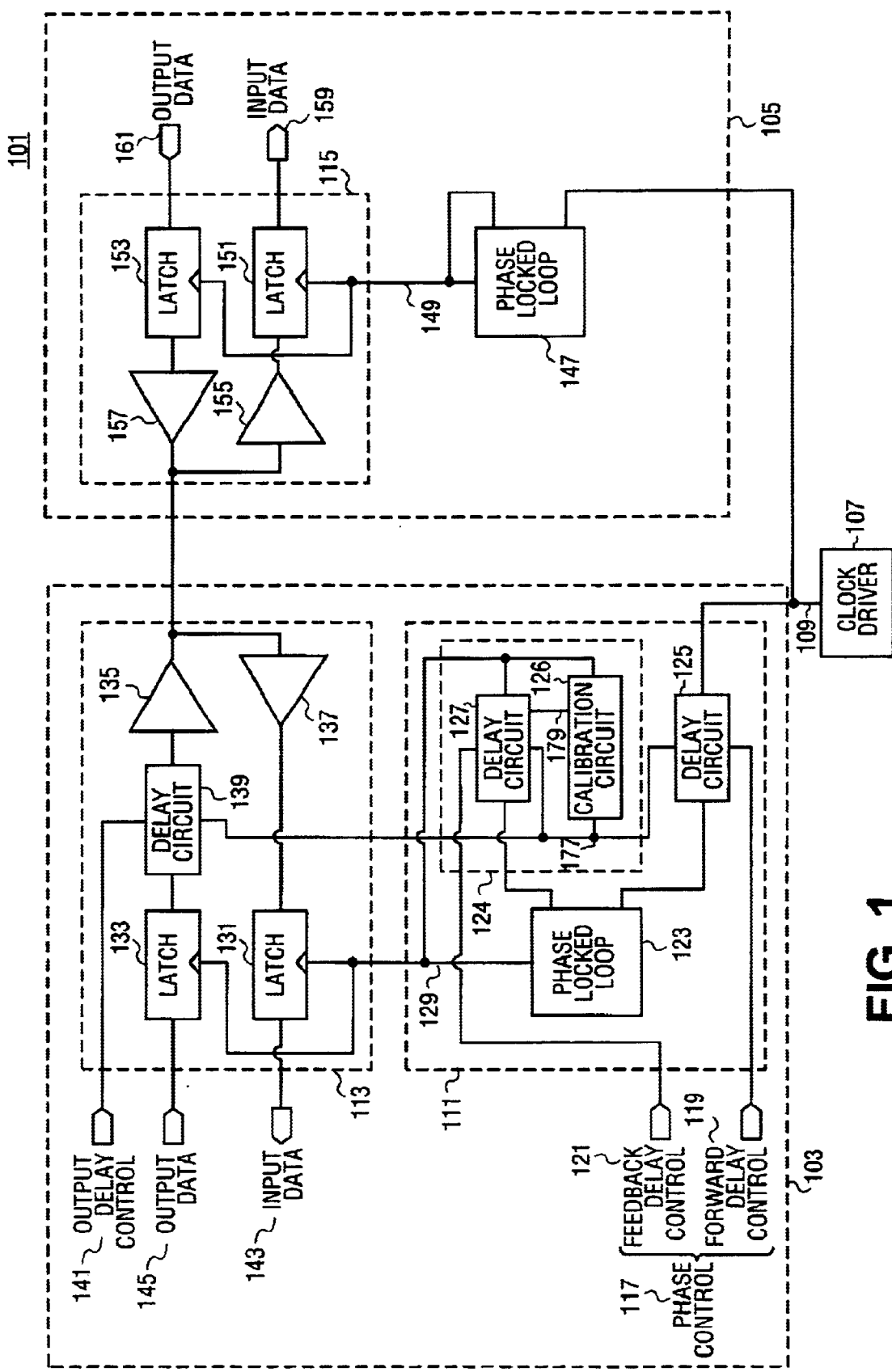
FIG. 1 a block diagram illustrating one embodiment of a phase adjustment circuit and an I/O buffer circuit in a system in accordance with the teachings of the present invention.

Methods and apparatuses for using phase adjustment and delay elements with I/O buffer circuitry of an integrated circuit chip are disclosed. In the following description, numerous specific details are set forth in order to provide a thorough understanding of the present invention. It will be apparent, however, to one having ordinary skill in the art that the specific detail need not be employed to practice the present invention. In other instances, well known materials or methods have not been described in detail in order to avoid obscuring the present invention.

In an example embodiment, a clock driver is used to generate a system clock to clock I/O data transmissions between integrated circuit chips in the system. Integrated circuit chips in the system receive the system clock and generate internal I/O clocks to clock I/O buffer circuitry in the respective integrated circuit chips. In one embodiment, at least one of the integrated circuit chips in the system includes a phase adjustment circuit coupled to receive the system clock and generate an internal I/O clock having a selectable phase difference from the system clock. That is, in one embodiment of the present invention, the phase adjustment circuit adjusts the I/O clock of the integrated circuit chip to be out of phase with the system clock by a selectable amount.

In the example embodiment, other chips in the system generate their own respective I/O clocks, which are in phase with the system clock. In one embodiment, the I/O clock of the integrated circuit is used to clock the I/O buffer circuitry of the integrated circuit chip. Thus, one embodiment of the I/O buffer circuit of the integrated circuit chip is clocked out of phase relative to other I/O buffer circuits of other integrated circuit chips in the system by a selectable amount.

In an example embodiment of the present invention, the phase adjustment circuit generates the I/O clock with a selectable phase difference from the system clock using calibrated delay elements. For instance, a calibrated delay element is coupled to a reference clock input of a PLL circuit of the phase adjustment circuit and another calibrated delay element is coupled to a feedback clock input of the PLL circuit. Using the calibrated delay elements coupled to the reference clock and feedback clock inputs of the PLL circuit, the phase difference from the system clock can be introduced selectively into the I/O clock generated by the phase adjustment circuit.

In one embodiment, the I/O buffer circuit of the integrated circuit chip also includes a calibrated delay circuit in an I/O data path of the I/O buffer circuit. In one embodiment, the calibrated delay element is included in an output data path of the I/O data buffer circuit. In another embodiment, the calibrated delay element may be included in an input data path of the I/O buffer circuit. In one embodiment, the calibrated delay element in the I/O data path of the I/O buffer circuit of the integrated circuit provides the effect of input data transmissions to the integrated circuit to be clocked out of phase with output data transmissions from the integrated circuit.

Using the phase adjustment circuit and the delay circuit in the I/O buffer circuit of the integrated circuit chip in accordance with the teachings of the present invention, control of the phase of input and output data transmissions of the integrated circuit chip are provided. By adjusting the phase of the I/O data transmissions, I/O timing tests of the integrated circuit chip may be performed. In addition, the adjusted I/O timing of the chip may be utilized further for non-test purposes. For instance, I/O timing operations can be adjusted or fine-tuned in accordance with the teachings of the present invention. Accordingly, the I/O timing of integrated circuit chips in accordance with the teachings of the present invention may be fine-tuned to bring I/O operations of the chip with specification timing requirements.

To illustrate, FIG. 1 is a block diagram of one embodiment of a system 101 in accordance with the teachings of the present invention. In one embodiment, system 101 may be a motherboard, system board, or the like, having a plurality of integrated circuit chips 103 and 105 coupled thereto. For purposes of explanation, it may be assumed in this disclosure that integrated circuit chip 103 is a central processing unit (CPU) and integrated circuit chip 105 is a chipset. Of course, it is appreciated that integrated circuit chips 103 and 105 may be other types of chips in accordance with the teachings of the present invention. As shown in FIG. 1, system 101 includes a clock driver 107, which generates a system clock 109 that is coupled to be received by integrated circuit chips 103 and 105 of system 101. In the example embodiment of FIG. 1, integrated circuit chip 103 includes an I/O buffer circuit 113 and integrated circuit chip 105 includes an I/O buffer circuit 115. I/O buffer circuits 113 and 115 are coupled to one another to provide I/O data transmissions between integrated circuit chips 103 and 105 of system 101. In the example embodiment, I/O buffer circuit 115 is clocked in response to I/O clock 149, which is generated by PLL circuit 147. In the example embodiment, I/O clock 149 of integrated circuit chip 105 is in phase with system clock 109.

In an example embodiment, I/O buffer circuit 113 is clocked in response to I/O clock 129. In the example embodiment, I/O clock 129 is generated by phase adjustment circuit 111. In one embodiment, I/O clock 129 may be generated by phase adjustment circuit 111 to be out of phase with the system clock 109 by a selectable amount responsive to phase control information 117. Thus, I/O clock 129 may be out of phase with the other I/O clocks of system 101, such as I/O clock 149 in accordance with the teachings of the present invention.

As illustrated in FIG. 1, one embodiment of phase adjustment circuit 111 includes a PLL circuit 123 coupled to receive system clock 109 through delay circuit 125 at a reference clock input of PLL circuit 123. PLL circuit 123 generates I/O clock 129, which is coupled to be received at a feedback clock input of PLL circuit 123 through delay circuit 127. In one embodiment, delay circuit 127 is part of a delayed lock loop (DLL) circuit 124, which also includes a calibration circuit 126. As will be discussed in further detail below, calibration circuit 126 is coupled in one embodiment to generate calibration bias information 177 to calibrate delay circuits of integrated circuit chip 103 in accordance with the teachings of the present invention. In one embodiment, calibration circuit 126 generates calibration bias information 177 in response to I/O clock 129 and a delayed output 179 of delay circuit 127.

In one embodiment, delay circuits 125 and 127 are calibrated in response to calibration bias information 177 and are used to control the phase of I/O clock 129 in response to phase control information 117. In one embodiment, phase control information 117 includes a forward delay control signal 119, which is coupled to be received by delay circuit 125, and a feedback delay control signal 121, which is coupled to be received by delay circuit 127.

As shown in the depicted embodiment, I/O buffer circuit 113 includes an input data path from which input data 143 is received from an input buffer 137 through latch 131. In the illustrated embodiment, an output data path of I/O buffer circuit 113 includes an output buffer 135, which is coupled to receive output data 145 through latch 133. As illustrated, latches 131 and 133 are clocked in response to I/O clock 129.

In one embodiment, a delay circuit 139 is calibrated in response to calibration bias information 177 and is included in an I/O data path of I/O buffer circuit 113. For example, in the embodiment illustrated in FIG. 1, delay circuit 139 is coupled between latch 133 and output buffer 135 of the output data path. In the illustrated embodiment, delay circuit 139 provides a delay in the output data path in response to output delay control signal 141. In another embodiment, (not shown) delay circuit 139 may be included in an input data path of I/O buffer circuit 113.

In the illustrated embodiment, PLL circuit 147 of integrated circuit chip 105 receives system clock 109 at a reference clock input of PLL circuit 147 and I/O clock 149 is generated in phase with the system clock 109 and is received at a feedback input of PLL circuit 147. I/O buffer circuit 115 of integrated circuit chip 105 includes an output buffer 157 coupled to receive output data 161 through latch 153. I/O buffer circuit 115 includes an input buffer 155 through which input data 159 is received through latch 151. As illustrated, latches 151 and 153 are clocked in response to I/O clock 149.

It is appreciated that buffer circuits 135, 137, 155, and 157 are illustrated as driver circuits in FIG. 1. It is appreciated that buffer circuits 135, 137, 155 and 157 may be implemented as other circuits, such as for example inverters or the like in accordance with the teachings of the present invention.

Figure 2:
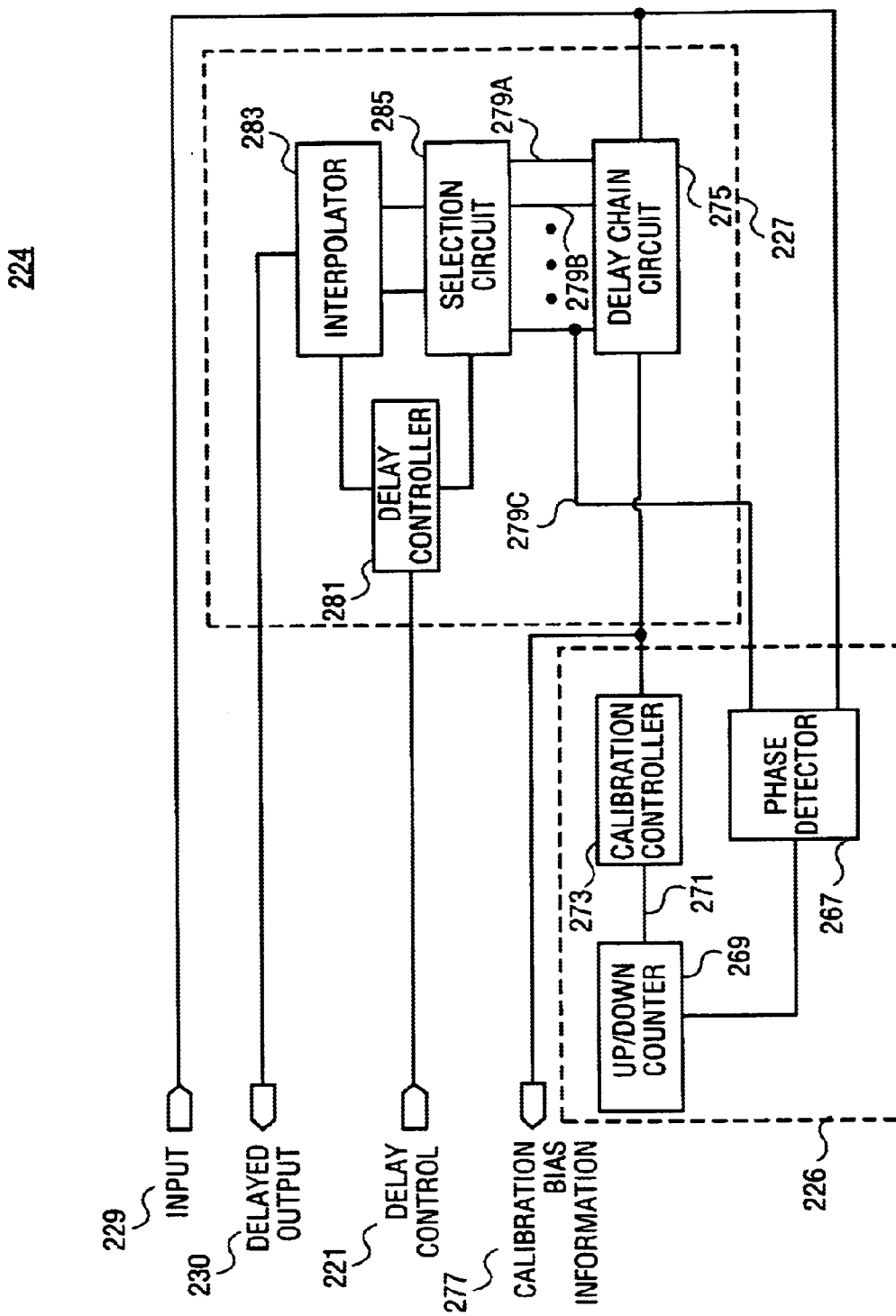
FIG. 2 is a block diagram illustrating one embodiment of a delay circuit in accordance with the of the present invention.

FIG. 2 is a block diagram illustrating one embodiment of a DLL circuit 224 in accordance with the teachings of the present invention. In one embodiment, DLL circuit 224 of FIG. 2 may be used in place of DLL circuit 124 of FIG. 1 in accordance with the teachings of the present invention. Referring back to FIG. 2, one embodiment of DLL circuit 224 includes a calibration circuit 226 and a delay circuit 227. In one embodiment, delay circuit 227 of FIG. 2 is substantially similar to delay circuit 125, or delay circuit 127 or delay circuit 139 of FIG. 1 in accordance with the teachings of the present invention. Referring back to FIG. 2, one embodiment of delay circuit 227 generates a delayed output 230 in response to input signal 229 and delay control signal 221. Delayed output 230 is calibrated in response to calibration bias information 277, which in one embodiment is generated by calibration circuit 226 in response to input signal 229 and a delayed output 279C of delay circuit 227.

In one embodiment, calibration circuit 226 includes a calibration controller 273 to generate calibration bias information 277 in response to up/down counter 269. Calibration circuit 226 also includes a phase detector 267 which is coupled to control up/down counter 269. In one embodiment, input signal 229 is an oscillating signal having a clock period of T that is coupled to be received by one input of a phase detector 267 as well as an input of a delay chain circuit 275 in delay circuit 227. As illustrated in the depicted embodiment, delay chain circuit 275 generates a plurality of at least N outputs, shown as 279A, 279B and 279C in FIG. 2. As will be discussed, delay chain circuit 275 includes a chain of delay circuits. The output of each delay circuit in the chain corresponds to one of the plurality of outputs 279A, 279B or 279C. In one embodiment, each delay circuit in delay chain circuit 275 introduces an additional $\Delta t$ delay in input signal 229 received at the input of delay chain circuit 275. Accordingly, the first one of the plurality of outputs 279A introduces a $\Delta t$ delay, the second output of the plurality of outputs 279 introduces a $2\Delta t$ delay, ..., and an $N^{th}$ one of the plurality of outputs 279C introduces an $N\Delta t$ delay to the input signal 229 received at the input of delay chain circuit 275.

In one embodiment of the present invention, a second input of phase detector 267 is coupled to receive the $N^{th}$ output 279C of delay chain circuit 275. In one embodiment, delay chain circuit 275 is calibrated such that the $N^{th}$ output 279C is input signal 229 delayed by one clock period T. In another embodiment, the $N^{th}$ output 279C may be the input signal 229 delayed by one half T, or an integer multiple of one half T, depending on the design. Phase detector 267 compares transitions or rising/falling edges in oscillations of input signal 229 with transitions or rising/falling edges in the $N^{th}$ output 279C of delay chain circuit 275. If input signal 229 oscillates at a frequency of F, then a clock period of the input signal 229 is equal to 1/F or T. Thus, if for example the input signal has a frequency F equal to 200 MHz, then a clock period T of that signal is equal to 1/200 MHz or 5 nanoseconds. Thus, the $N^{th}$ output 279C of delay chain circuit 275 would provide a delay of 5 nanoseconds in this example, assuming that the $N^{th}$ output 279C of delay chain circuit 275 delays input signal 229 by one clock period T.

In the illustrated embodiment, an output of phase detector 267 is received by an up/down counter 269. In one embodiment, up/down counter 269 is configured to be adjusted in response to an output of phase detector 267. Therefore, when the input signal 229 is out of phase with the $N^{th}$ output 279C of delay chain circuit 275, which is calibrated to be delayed by one clock period T, then up/down counter is incremented or decremented accordingly. In one embodiment, a calibration control signal 271 is output by up/down counter 269 and is coupled to be received by calibration controller 273. In one embodiment, calibration controller 273 generates calibration bias information 277, which as will be discussed includes bias signals coupled to received by the delay circuit elements of delay chain circuit 275. The $\Delta t$ delay of each one of the delay circuit elements in delay chain circuits 275 is adjusted in response to calibration bias information 277. Accordingly, when the $N^{th}$ output 279C of delay chain circuit 275 has been calibrated to be delayed by one clock period T of the input signal 229, up/down counter 269 will have stabilized. More generally, in an embodiment in which the $N^{th}$ output 279C is the input signal 229 delayed by one half T, or an integer multiple of one half T, transitions of the $N^{th}$ output 279C of delay chain circuit 275 are substantially aligned with transitions of input signal 229. Calibration control signal 271 will control calibration controller 273 to maintain the calibration bias information 277 to maintain the one clock period T delay of output 279C. It is appreciated that the calibrated delay provided by delay chain circuit 275 is independent over variations in process, voltage and temperature.

In one embodiment, delay control signal 221 is utilized to control or select the amount of delay generated in delayed output 230. For instance, in one embodiment, delay controller 281 is coupled to receive delay control signal 221 and generates the appropriate select signals used to control a selection circuit 285, which is coupled to receive the plurality of at least N outputs 279A, 279B and 279C of delay chain circuit 275. In one embodiment, selection circuit 285 is a multiplexer type circuit used to select one of the plurality of at least N outputs 279A, 279B and 279C of delay chain circuit 275 to be delayed output 230.

In one embodiment, increased resolution may be provided for delayed output 230 with the use of an interpolator 283, which in one embodiment is coupled to receive a neighboring pair of outputs from selection circuit 285 in response to delay controller 281. In one embodiment, interpolator 283 generates delayed output 230 by dividing the $\Delta t$ delay increments of delay chain circuit 275 into finer delay increments. In one embodiment, the interpolation provided using known techniques by interpolator 283 is provided by shorting the input taps and output taps of a delay element with a programmed combination of tap driver weights or strengths. The calibrated delay elements and interpolator provide capability to produce fine delay adjustments in accordance with the teachings of the present invention.

Figure 3:
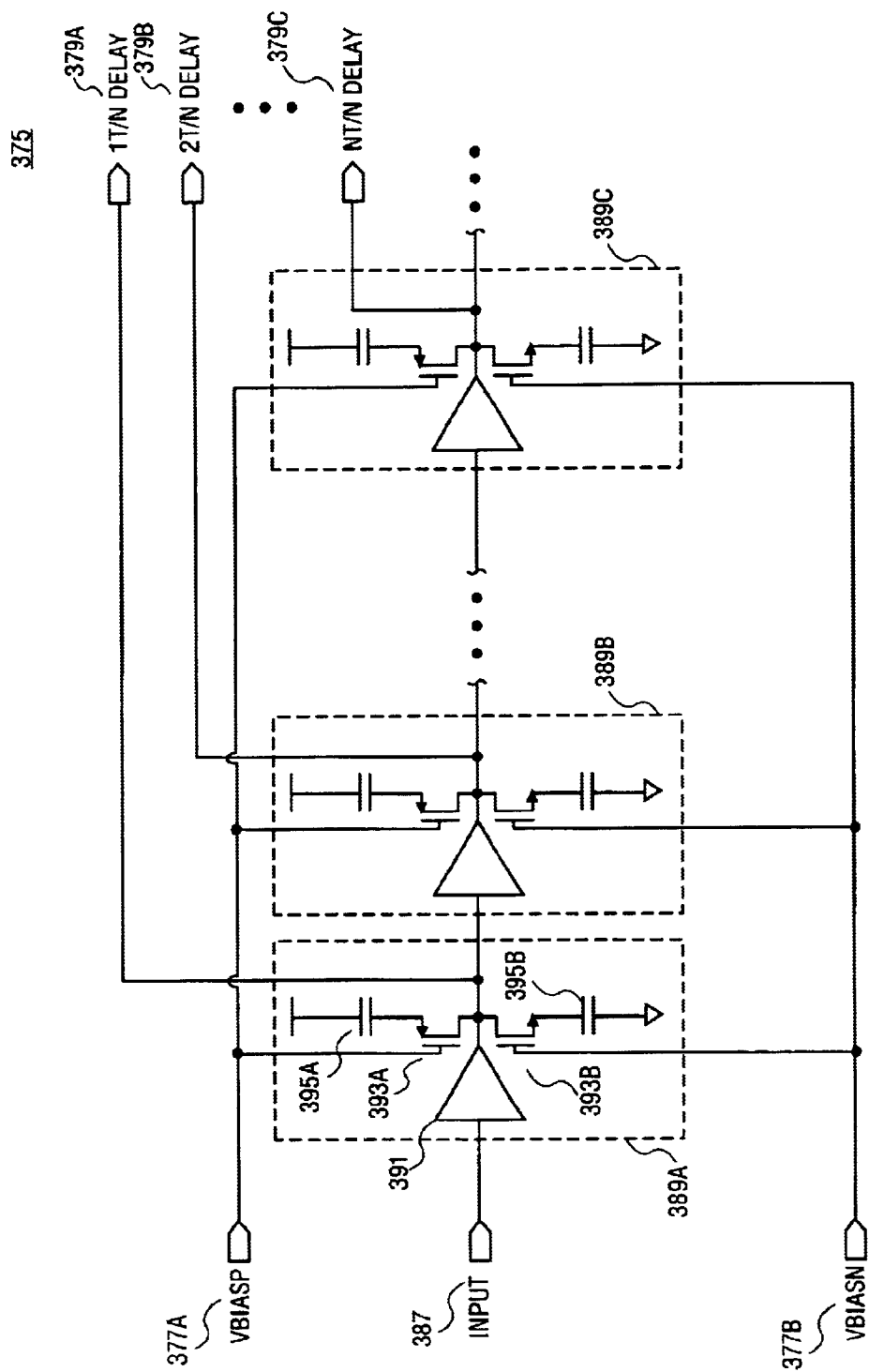
FIG. 3 is a schematic illustrating one embodiment of a delay chain circuit in accordance with teachings of the present invention.

FIG. 3 is a schematic illustrating one embodiment of a delay chain circuit 375 in accordance with the teachings of the present invention. In one embodiment, delay chain circuit 375 of FIG. 3 may be used in place of delay chain circuit 275 of FIG. 2 in accordance with the teachings of the present invention. As illustrated in the embodiment depicted in FIG. 3, delay chain circuit 375 includes a plurality of at least N delay circuit elements, illustrated as 389A, 389B and 389C coupled in succession. As illustrated, delay circuit element 389A receives input 387 and generates a delayed output 379A. Delayed output 379A is coupled to be received by delay circuit element 389B, which generates delayed output 379B, ..., etc. The $N^{th}$ delay circuit element 389C generates delayed output 379C. It is appreciated that in one embodiment, delay chain circuit 375 may include more than N delay circuit elements.

As mentioned earlier, in one embodiment, the delayed output 379C of the $N^{th}$ delay circuit element 389C is the signal received at input 387 delayed by one clock period T. In one embodiment, each delay circuit element 389A, 389B and 389C in the delay chain circuit 375 introduces an additional $\Delta t$ delay. In one embodiment, each $\Delta t$ delay is equal to T/N, where T is one clock period and N is the number of delay elements. Therefore, the output 379A of delay circuit element 389A is delayed 1T/N, the output 379B of delay circuit element 389B introduces a 2T/N delay, ..., etc., and the delayed output 379C of delay circuit element 389C is delayed NT/N or T.

As illustrated in FIG. 3, delay circuit element 389A includes a buffer 391 coupled to receive input 387. It is appreciated that in the embodiment illustrated in FIG. 3, buffer 391 is illustrated as a driver circuit. However, buffer 391 may be implemented using other types of circuits, such as for example inverter circuits or the like. As illustrated in the depicted embodiment, the output of buffer 391 is coupled to power through switch 393A and capacitor 395A, and is coupled to ground through switch 393B and capacitor 395B. In one embodiment, switches 393A and 393B are P-channel and N-channel transistors, respectively, which provide variable resistive connections to capacitors 395A and B, respectively. In one embodiment, the variable resistance provided by switches 393A and 393B are controlled in response to calibration bias control signals VBIASP 377A and VBIASN 377B, respectively.

In operation, increased delay may be provided by delay circuit element 389A by decreasing the resistance to capacitor 395 through switches 393A and 393B. Conversely, decreased delay may be provided by delay circuit element 389A by increasing the resistance to capacitor 395 through switches 393A and 393B, in response to calibration bias control signals VBIASP 377A and VBIASN 377B, respectively. As illustrated in FIG. 3, the schematics for the other circuit delay elements 389B and 389C of delay chain circuit 375 are substantially similar to the schematic of delay circuit element 389A.

Figure 4:
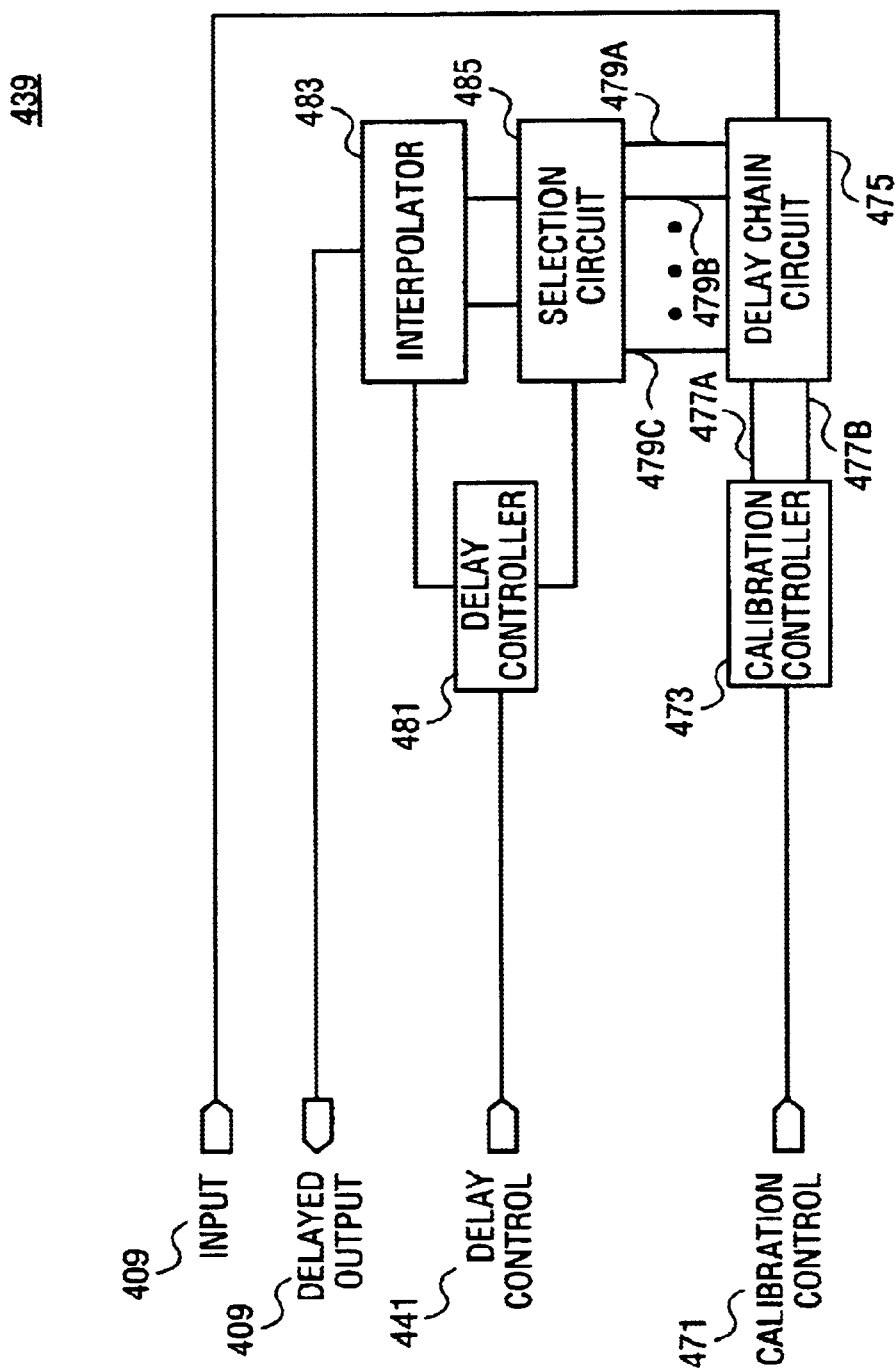
FIG. 4 is a block diagram illustrating another embodiment of a delay circuit in accordance with the teachings of the present invention.

FIG. 4 is a block diagram of another embodiment of a delay circuit 439 in accordance with the teachings of the present invention. In one embodiment, delay circuit 439 of FIG. 4 may be used as an alternative to the delay circuits of FIG. 1. As will be appreciated, one embodiment of delay circuit 439 shares a number of similarities with the embodiment of delay circuit 227 of FIG. 2. Referring back to FIG. 4, delay circuit 439 receives an input 409 at an input of delay chain circuit 475. In one embodiment, delay chain circuit 375 of FIG. 3 may be used in place of delay chain circuit 475 of FIG. 4. Delay chain circuit 475 generates a plurality of at least N delayed outputs, illustrated as 479A, 479B and 479B. Similar to delay chain circuit 275 of FIG. 2 or delay chain circuit 375 of FIG. 3 an $N^{th}$ output 479C of delay chain circuit 475 delays input 409 by one clock period T.

As illustrated in the depicted embodiment, a calibration control signal 471 is received by calibration controller 473, which generates bias control signals 477A and 477B, which are coupled to be received by delay chain circuit 475. In one embodiment, bias control signals 477A and 477B are used to calibrate the plurality of at least N outputs 479A, 479B, and 479C such that the $N^{th}$ output 479C delays input 409 by one clock period T. In one embodiment, calibration control signal 471 is calibration control signal 271, which is generated by up/down counter 269 of the calibration circuit 226 of FIG. 2.

Referring back to FIG. 4, a delay control signal 441 is received by a delay controller 481 which generates the appropriate control signals for a selection circuit 485 and an interpolator 483. In one embodiment, selection circuit 485 is coupled to receive the plurality of at least N outputs 479A, 479B and 479C of delay chain circuit 475. In one embodiment, interpolator 483 is not included and selection circuit 485 is used to select the appropriate one of the plurality of at least N outputs 479A, 479B or 479C as delayed output 429. In another embodiment, interpolator 483 is coupled to receive a neighboring pair of outputs from selection circuit 485. In this embodiment, interpolator 483 adds additional resolution to delayed output 429 by dividing the $\Delta t$ delay between outputs of delay chain circuit 475 into finer delay increments.

Embodiments of the phase adjustment circuitry 111 for I/O buffer circuitry 113 in accordance with the teachings of the present invention may be used in a variety of applications including for example I/O timing tests of integrated circuit chips. In another example, the timing of I/O operations of integrated circuit chips may be adjusted or fine-tuned such that the chips function within specification requirements. To illustrate, assume for example that integrated circuit chip 103 of FIG. 1 is a CPU, that integrated circuit chip 105 is a chipset and that system 101 is a motherboard on which integrated circuit chip 103 and integrated circuit chip 105 and clock driver 107 are included. As will be shown, embodiments of the present invention may be used to test I/O timing parameters such as minimum and maximum clock to output times, hold times, set up times, or the like.

Figure 5:
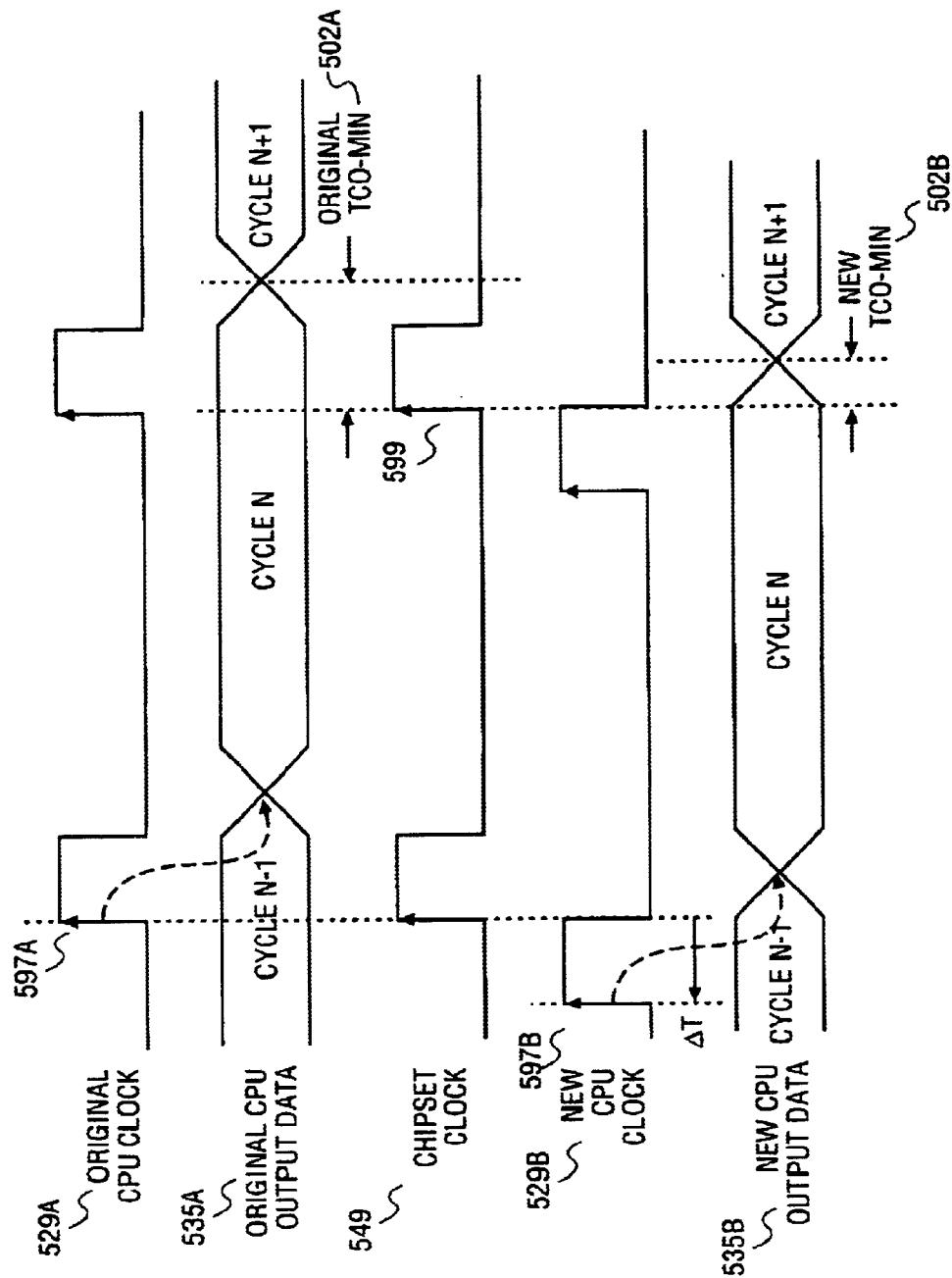
FIG. 5 is a timing diagram illustrating one embodiment of a clock to output characteristic of an output signal being tested in accordance with the teachings of the present invention.

Referring briefly back to FIG. 1, clock to output times refer to the amount of time for output data to appear at the output of driver 135 in response to a rising clock edge of I/O clock 129 of integrated circuit chip 103. It is appreciated that system clock 109 is often used for this measurement as system clock 109 and I/O clock 129 are normally in phase. To illustrate, assume that integrated circuit chip 103 is a CPU and that integrated circuit chip 105 is a chipset. FIG. 5 is an illustration of timing diagrams of one embodiment of the present invention in which minimum clock to output times (TCO-MIN) may be tested in accordance with the teachings of the present invention. As shown, a rising clock edge 597A of CPU clock 529A results in the transition of CYCLE N−1 to CYCLE N of CPU output data 535A. A rising clock edge 599 of chipset clock 549 occurs during cycle N of the CPU output data 535A. The minimum clock to output parameter TCO-MIN 502A is illustrated in FIG. 5, which is the minimum amount of time between the rising clock edge 599 of chipset clock 549 and the time in which CYCLE N transitions to CYCLE N+1 in the CPU output data 535A.

The minimum clock to output timing parameter may be tested by shifting the phase of the CPU clock 529A in accordance with the teachings of the present invention. In the illustrated example, CPU clock 529B is shown being shifted out of phase with chipset clock 549 by $\Delta t$. In one embodiment, CPU clock 529B is shifted out of phase or pulled back relative to chipset clock 549 by adjusting the feedback delay control signal 121 to add $\Delta t$ more delay relative to forward delay control signal 119. In one embodiment, forward delay control signal 119 is configured to add no delay in this situation. Referring back to FIG. 5, rising clock edge 597B of CPU clock 529B results in the corresponding transition between CYCLE N−1 and CYCLE N of the CPU output data 535B. As illustrated, rising clock edge 599 of chipset clock 549 still occurs within CYCLE N of CPU output data 535B. However, the minimum clock to output timing parameter TCO-MIN 502B is now less than the TCO-MIN 502A. In one embodiment, the minimum clock to output timing parameter may be stressed to cause system failures in order to test the CPU I/O timing paths in accordance with the teachings of the present invention. In one embodiment, the system will fail when rising clock edge 599 of chipset clock 549 does not occur within CYCLE N of CPU output data 535B.

Figure 6:
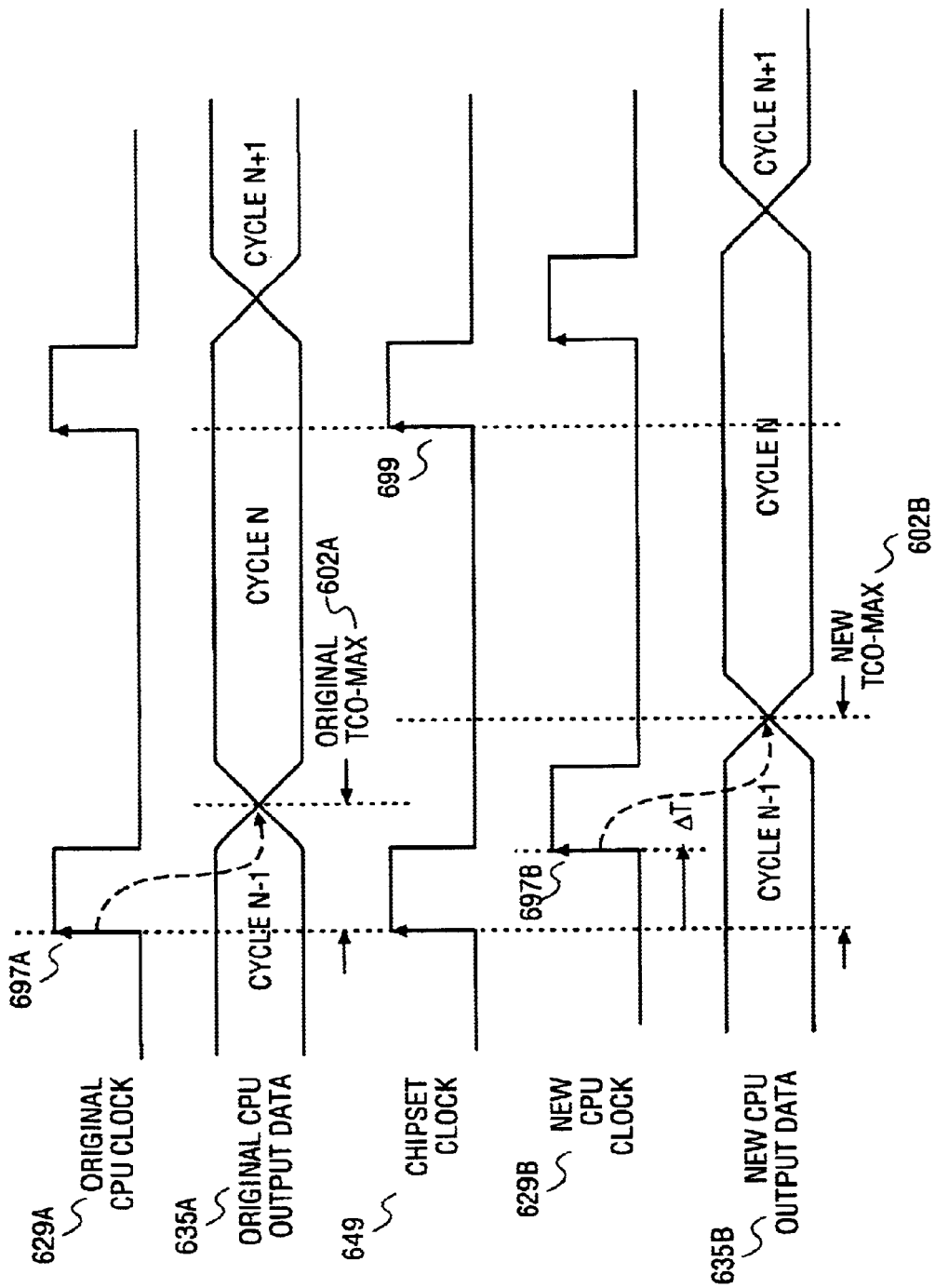
FIG. 6 is a timing diagram of another embodiment of a clock to output characteristic of an output signal being tested in accordance with the teachings of the present invention.

FIG. 6 illustrates timing diagrams showing maximum clock to output timing parameters being tested in accordance with the teachings of the present invention. In particular, CPU clock 629A is illustrated having a rising clock edge 697A, which causes a transition from CYCLE N−1 to CYCLE N of the CPU output data 635A. As shown, rising clock edge 699 of chipset clock 649 occurs during CYCLE N of CPU output data 635A, and therefore output data may be latched properly by the chipset. The maximum clock to output timing parameter is illustrated in FIG. 6 as TCO-MAX 602A, which is the amount of time between a rising clock edge of chipset clock 649 and a corresponding transition between cycles on CPU output data 635A and 635B.

In the illustrated embodiment, the maximum clock to output timing parameter is tested by shifting the CPU clock 629B to be out of phase with chipset clock 649. For example, CPU clock 629B is pushed out relative to chipset clock 649 by adjusting the forward delay control signal 119 to add an additional $\Delta t$ delay relative to the feedback delay control signal 121. In one embodiment, feedback delay control signal 121 is set not to add delay in this situation. Accordingly, rising clock edge 697B of CPU clock 629B results in the transition from CYCLE N−1 to CYCLE N of CPU output data 635B. Accordingly, the updated maximum clock to output timing parameter, TCO-MAX 602B is illustrated in FIG. 6 as shown. In one embodiment, TCO-MAX 602B is stressed to cause a system failure to test the CPU I/O timing path in accordance with the teachings of the present invention. In one embodiment, the system will fail when rising clock edge 699 of chipset clock 649 does not occur within CYCLE N of CPU output data 635B. It is noted that a system failure could be accomplished by adjusting output delay control signal 141 only. In this case, the CPU input timing will remain the same.

Figure 7:
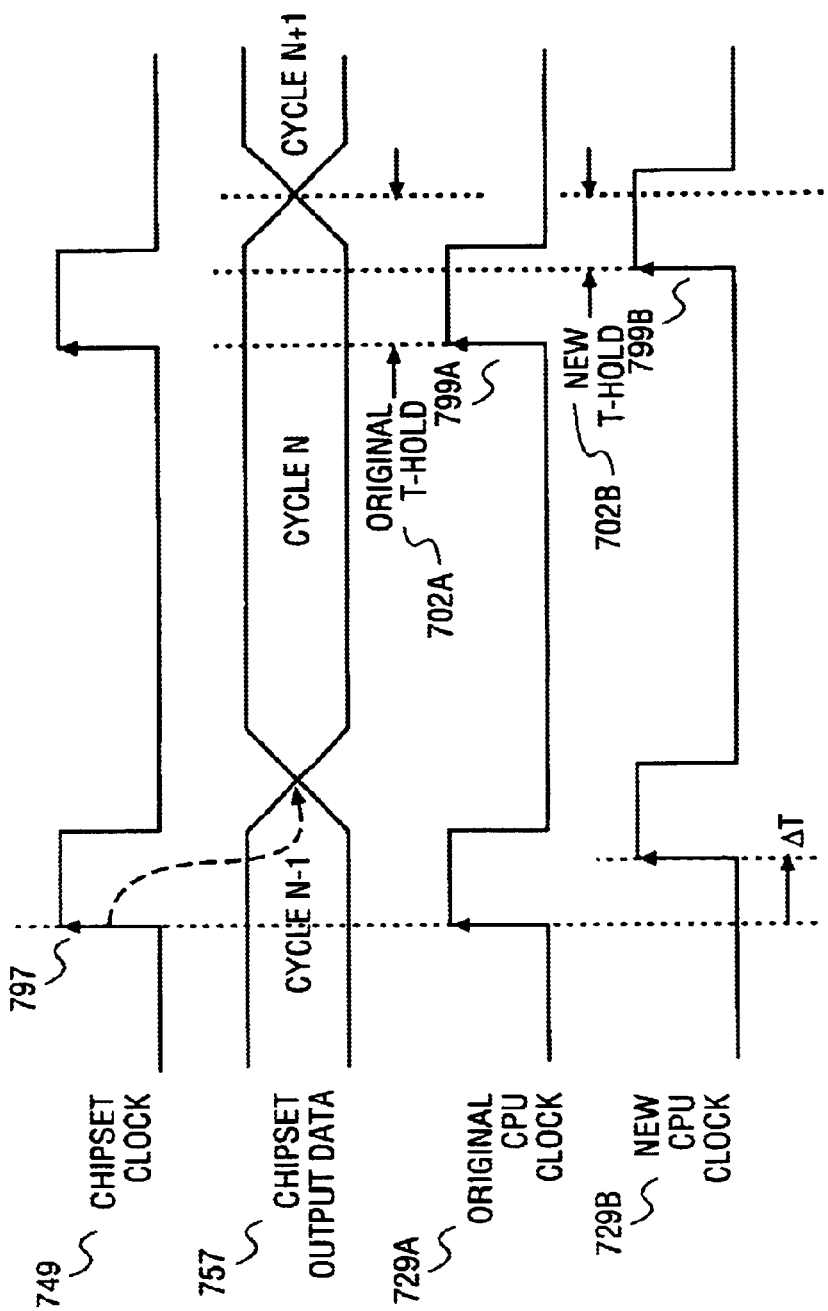
FIG. 7 is a timing diagram illustrating one embodiment of a hold time characteristic of an output signal being tested in accordance with the teachings of the present invention.

FIG. 7 is a timing diagram illustrating one embodiment of hold-time timing parameters of data being sent from a chipset to a CPU in accordance with the teachings of the present invention. In particular, FIG. 7 shows rising clock edge 797 of chipset clock 749 resulting in a corresponding transition from CYCLE N−1 to CYCLE N of chipset output data 757. As shown, rising clock edge 799A of CPU clock 729A occurs during CYCLE N of chipset output data 757. Thus, data may be latched properly by the CPU. The hold-time timing parameter is illustrated in FIG. 7 as T-HOLD 702A, which is the time between rising clock edge 799A of CPU clock 729A and the time at which chipset output data 757 transitions from CYCLE N to CYCLE N+1.

In order to test the hold-time timing parameter, the CPU clock 729B is pushed out relative to the chipset clock 749 by increasing the forward delay signal 119 by $\Delta t$ relative to the feedback delay control signal 121. In one embodiment, feedback delay control signal 121 is set not to add delay in this situation. Accordingly, CPU clock 729B shows that the rising clock edges of the CPU clock 729B are pushed out an additional $\Delta t$ relative to chipset clock 749. Rising clock edge 799B of CPU clock 729B is shown to occur during CYCLE N of output data 757, and therefore data may be latched properly by the CPU from the chipset. The new hold-time timing parameter is shown in FIG. 7 as T-HOLD 702B, which is the amount of time between rising clock edge 799B of CPU clock 729B and the transition of chipset output data 757 from CYCLE N to CYCLE N+1. In one embodiment, the T-HOLD 702B timing parameter can be stressed to cause system failures to test the CPU I/O timing paths. In one embodiment, a system failure will occur if rising clock edge 799B of CPU clock 729B does not occur within CYCLE N of chipset output data 757.

Figure 8:
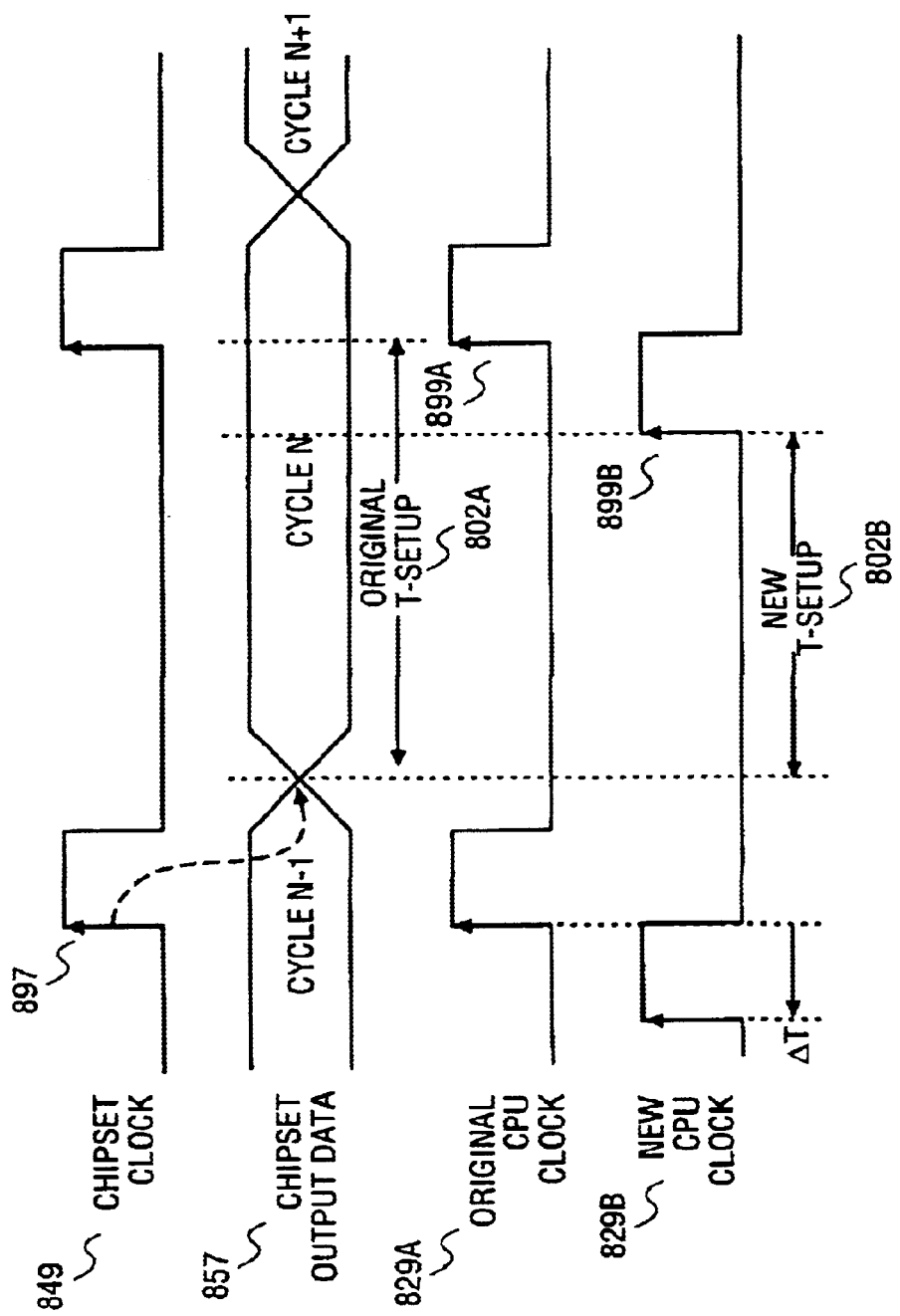
FIG. 8. is a timing diagram illustrating one embodiment of a set up time characteristic of an output signal being tested in accordance with the teachings of the present invention.

FIG. 8 is an illustration of timing diagrams showing set up time timing parameters of data being transferred from a chipset to a CPU being tested in accordance with the teachings of the present invention. As shown, rising clock edge 897 of chipset clock 849 results in the transition of chipset output data 857 from CYCLE N−1 to CYCLE N. In this example, both the forward delay control signal 119 and the feedback delay control signal 121 are set to zero at this time. As illustrated in FIG. 8, rising clock edge 899A of CPU clock 829A occurs during CYCLE N of chipset output data 857. Accordingly, there is not a system failure at this time. The original set up timing parameter is shown in FIG. 8 as T-SETUP 802A, which is the amount of time from a transition between cycles of chipset output data 857 and a subsequent corresponding rising clock edge of the CPU clock 829A or 829B.

In one embodiment, the setup time parameter may be tested in accordance with the teachings of the present invention by shifting the phase of the CPU clock to be out of phase with the chipset clock 849. In FIG. 8, CPU clock 829B is pulled in relative to chipset clock 849 by $\Delta t$ by increasing the feedback delay control signal 121 relative to the forward delay control signal 119. In one embodiment, forward delay control signal 119 is set not to add delay in this situation. The new setup time timing parameter is illustrated in FIG. 8 as T-SETUP 802B, which is the amount of time from a transition between cycles of chipset output data 857 and a subsequent corresponding rising clock edge 899B of CPU clock 829B. In one embodiment, the T-SETUP parameter 802B can be stressed to cause a system failure to test the CPU I/O timing paths in accordance with the teachings of the present invention. In one embodiment, a system failure can be triggered by a rising clock edge 899B not occurring within a CYCLE N of chipset output data 857.

Figure 9:
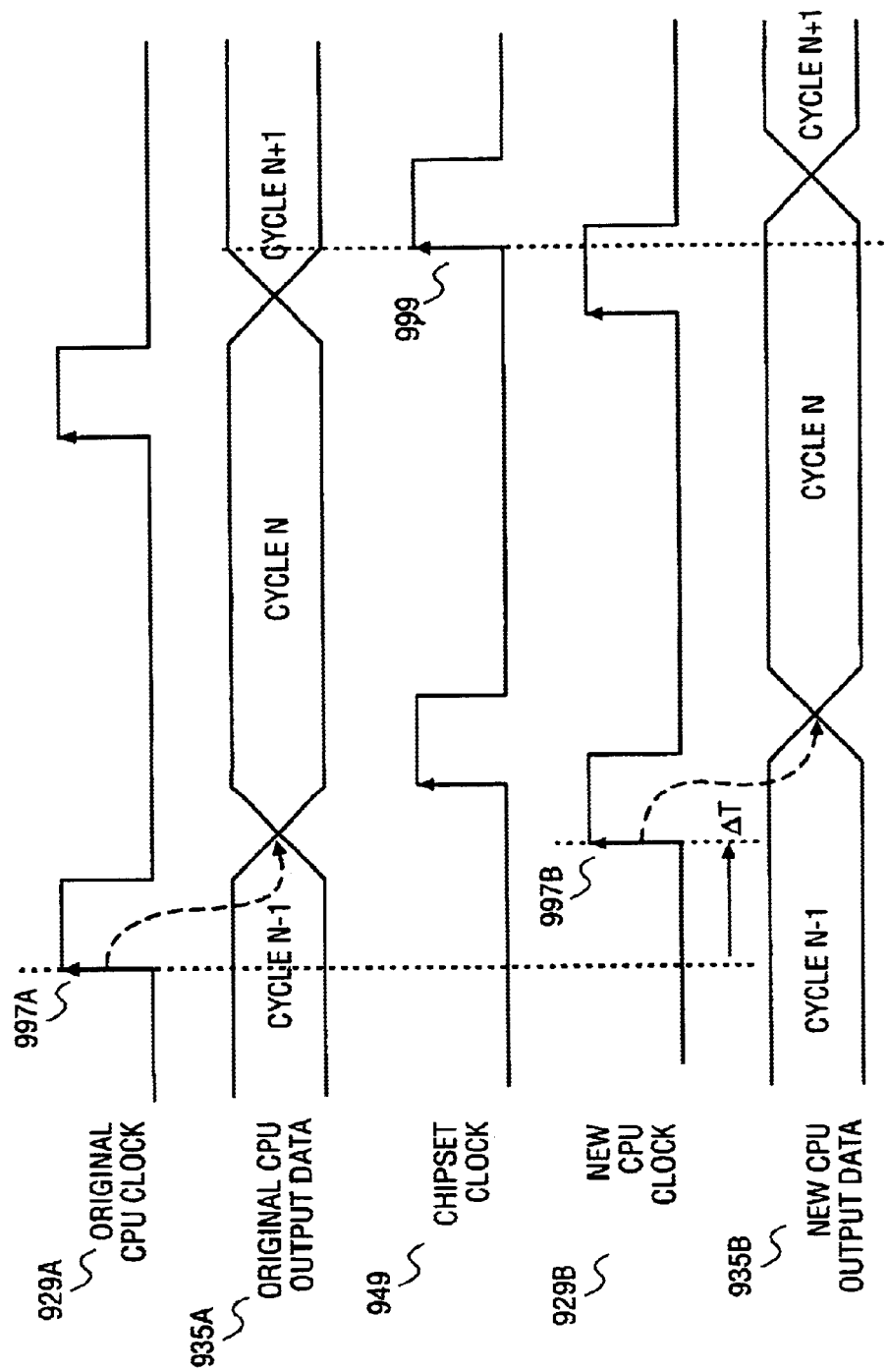
FIG. 9 is a timing diagram illustrating one embodiment of overcoming an I/O timing defect in an output signal in accordance with the teachings of the present invention.

FIG. 9 is a timing diagram illustrating an integrated circuit chip including phase adjustment circuitry in association with I/O buffer circuitry being adjusted or fine-tuned to allow the integrated circuit chip to function properly in the system with I/O timing path defects. For instance, assume that the integrated circuit chip is a CPU and that data is transferred between the CPU and the chipset on a motherboard in accordance with the teachings of the present invention. For instance, FIG. 9 shows a rising clock edge 997A of a CPU clock 929A resulting in a corresponding transition of CPU output data 935A from CYCLE N−1 to CYCLE N. In this example, forward delay control signal 119 and feedback delay control signal 121 are set not to add delay at this time.

In this example, it is also assumed that there is an I/O timing or design defect in the system in which the CPU and chipset are included. Consequently, chipset clock 949 is out of phase with CPU clock 929A, and thus, the rising clock edge 999 of chipset clock set 949 does not occur within CYCLE N of CPU output data 935A. In one embodiment, rising clock edge 999 not occurring during CYCLE N of CPU output data 935A would result in a system failure. Prior to the present invention, a system exhibiting such an I/O timing defect would be discarded because of such a system failure.

In order to remedy this situation, the phase of the CPU clock 929B is adjusted in accordance with the teachings of the present invention such that the system no longer fails. In particular, FIG. 9 shows CPU clock 929B having a clock edge 997B that is pushed out relative to chipset clock 949 by adding $\Delta t$ with forward delay control signal 119. In one embodiment, feedback delay control signal 121 is set not to add delay in this situation. As a result, rising clock edge 997B, which results in the transition of CPU output data 935B from CYCLE N−1 to CYCLE N is pushed out correspondingly. Thus, rising clock edge 999 of chipset clock 949 now occurs within CYCLE N of CPU output data 935B, thereby resulting in the system no longer failing during the I/O transmission. In one embodiment, the phase of the CPU clock is adjusted an amount small enough such that data communications in the opposite direction are still within I/O timing tolerances. Therefore, a system including a integrated circuit chip having phase adjustment circuitry in association with I/O buffer circuitry in accordance with the teachings of the present invention need not be discarded.

Figure 10:
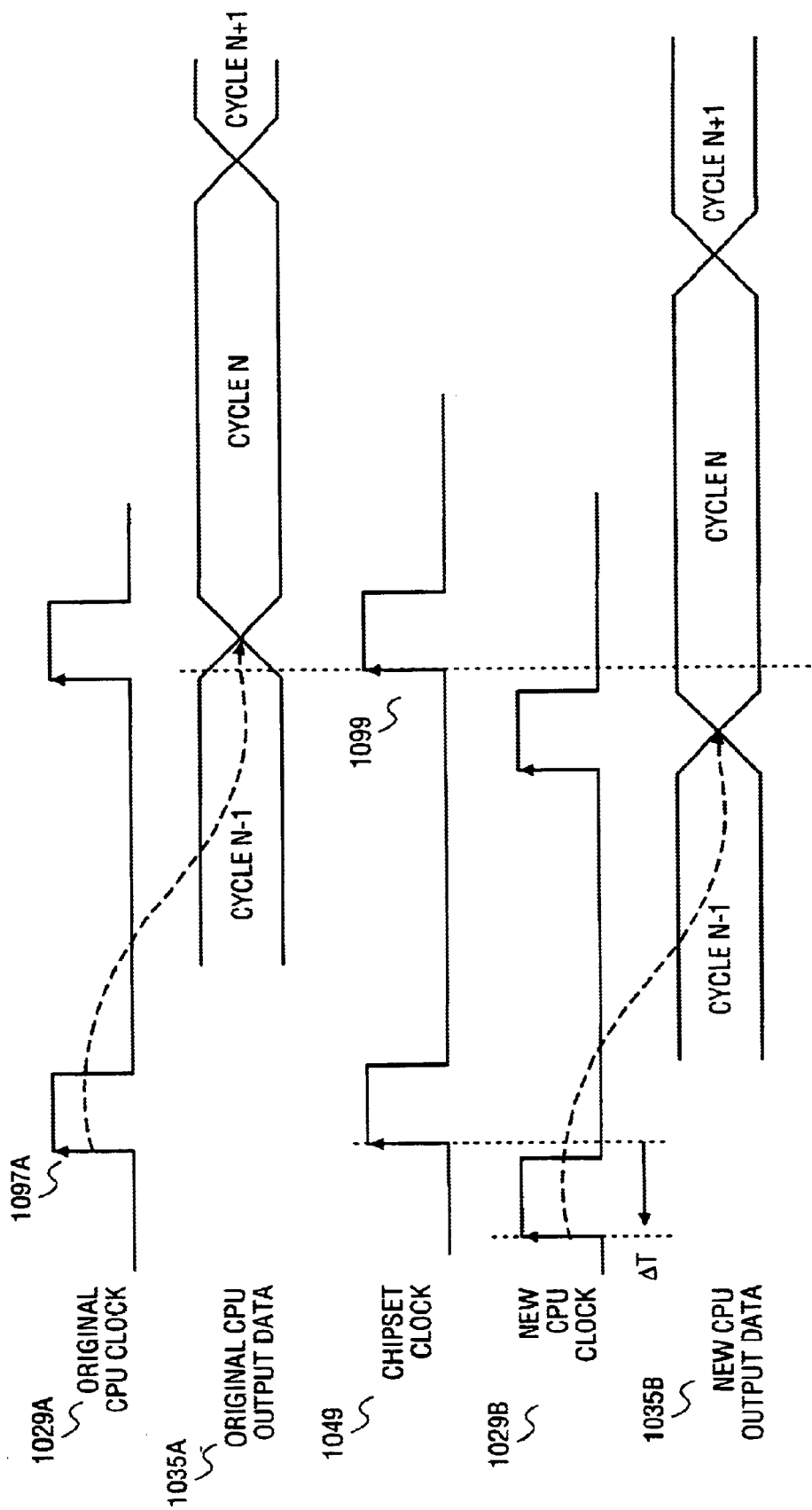
FIG. 10 is a timing diagram illustrating another embodiment of overcoming an I/O timing defect in an output signal in accordance with the teachings of the present invention.

In another example, FIG. 10 illustrates a rising clock edge 1097A of a CPU clock 1029A resulting in a transition of CPU output data 1035A from CYCLE N−1 to CYCLE N. In the example illustrated in FIG. 10, chipset clock 1049 is in phase with the CPU clock 1029A, but rising clock edge 1099 of chipset clock 1049 does not occur within CYCLE N of CPU output data 1035A.

In the illustrated embodiment, the phase of CPU clock 1029B is adjusted such that Δt delay is added by feedback delay control signal 121 to pull in the CPU clock 1029B relative to chipset clock 1049 by Δt. In one embodiment, forward delay control signal 119 is set not to add delay at this time. By pulling in CPU clock 1029B by Δt as illustrated, CPU output data 1035B is pulled in correspondingly. As a result, the rising clock edge 1099 now occurs within CYCLE N of CPU output data 1035B, thereby correcting the system failure described earlier. In one embodiment, CPU clock 1029B is shifted by an amount Δt small enough such that data communications from other chips in the system to the CPU are still within timing tolerances, and thereby do not result in system failures.

Figure 11:
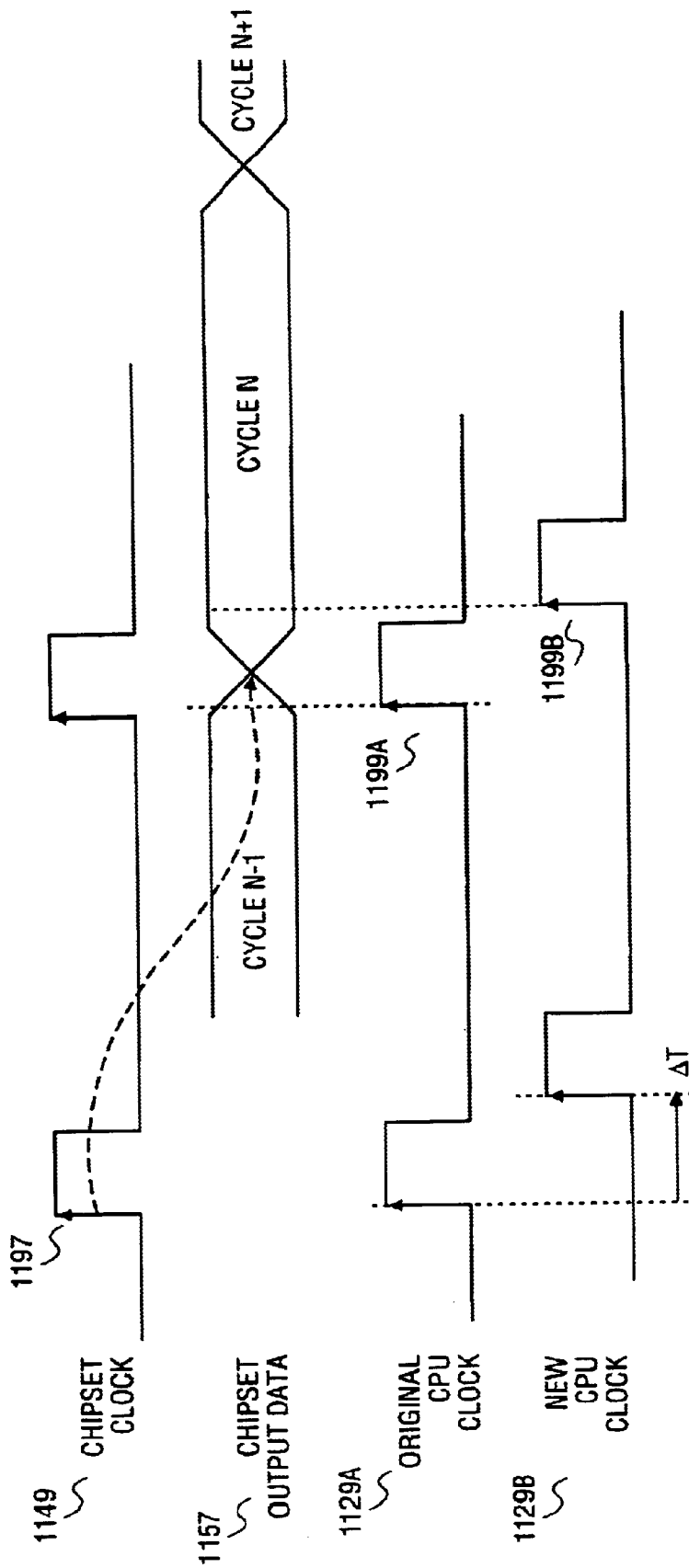
FIG. 11 is a timing diagram illustrating one embodiment of overcoming an I/O timing defect in an input signal in accordance with the teachings of the present invention.

In yet another example, FIG. 11 is a timing diagram illustrating a rising clock edge 1197 of chipset clock 1149 resulting in a transition of chipset output data 1157 from CYCLE N−1 to CYCLE N. In the embodiment illustrated in FIG. 11, CPU clock 1129A is in phase with chipset clock 1149, but since rising clock edge 1199A of CPU clock 1129A does not occur within CYCLE N of chipset output data 1157, there is a system failure. In order to remedy this system failure, CPU clock 1129B is shifted to be out of phase with chipset clock 1149 by Δt. In one embodiment, CPU clock 1129B is shifted by adding a Δt delay with forward delay control signal 119. In one embodiment, feedback delay control signal 121 is set not to add delay at this time. As a result, CPU clock 1129B is pushed out Δt relative to chipset clock 1149, resulting in rising clock edge 1199B of CPU clock 1129B occurring within CYCLE N of chipset output data 1157. As a result, the system failure described earlier has been remedied in accordance with the teachings of the present invention. In one embodiment, CPU clock 1129B is shifted by an amount Δt small enough such that data communications from the CPU to the chipset remain within timing tolerances such that a system failure does not occur.

Figure 12:
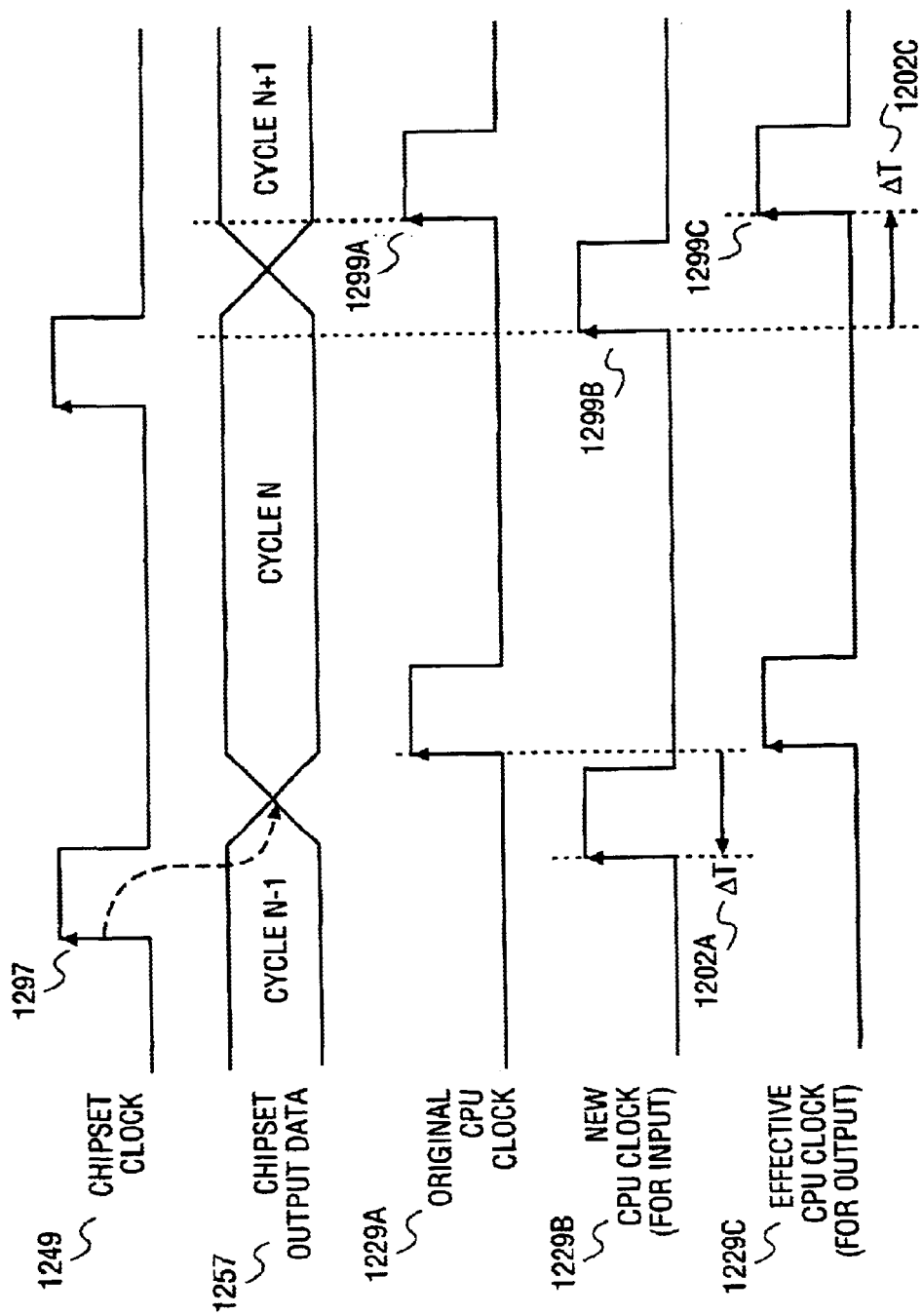
FIG. 12 is a timing diagram illustrating another embodiment of overcoming an I/O timing defect in an input signal in accordance with the teachings of the present invention.

In still another example, FIG. 12 is a timing diagram illustrating another situation in which a chipset clock 1249 is out of phase with a CPU clock 1229A. In one embodiment, the phase difference between chipset clock 1249 and CPU clock 1229A may occur as a result of a defect in the I/O clock timing paths of the system. As shown, rising clock edge 1297 of chipset clock 1249 results in a transition of chipset output data 1257 from CYCLE N−1 to CYCLE N. In the illustrated example, rising clock edge 1299A of CPU clock 1229A does not occur within CYCLE N of chipset output data 1257, consequently resulting in a system failure for input data transmissions from the chipset to the CPU.

In order to remedy the system failures for CPU inputs from the chipset, the phase of CPU clock 1229B for inputs is adjusted by Δt 1202A in accordance with the teachings of the present invention. In one embodiment, CPU clock 1229B for inputs is pulled in relative to chipset clock 1249 by adding Δt to feedback delay control signal 121. In one embodiment, forward delay control signal 119 is set not to add delay at this time. As a result of the phase of CPU clock 1229B being phase shifted by Δt 1202A, rising clock edge 1229B of CPU clock 1229B now occurs within CYCLE N of chipset output data 1257. Accordingly, inputs to the CPU to the chipset are now possible and do not result in system failures as described previously.

In one embodiment, the phase of data outputs from the CPU are also adjusted by Δt 1202C such that there are no system failures when transmitting data from the CPU to other chips in the system. For instance, there may be a situation in which pulling the CPU clock 1229B in by Δt 1202A for CPU inputs would have the side-effect of resulting in system failures for CPU outputs, assuming CPU clock 1229B were to be used to clock outputs. Accordingly, the effective CPU clock for data outputs from the CPU is shown as effective CPU clock 1229C. In one embodiment, the phase of the effective CPU clock 1229C is adjusted by Δt 1202C by adding Δt 1202C delay with the output delay control signal 141 in the I/O buffer circuitry 113, as illustrated in FIG. 1. In the embodiment illustrated, delay circuit 139 delays data output by output buffer 135 Δt 1202C, as controlled by output delay control signal 141. In the embodiment illustrated in FIG. 12, the effective CPU clock 1229C for CPU outputs has been adjusted to be in phase with the CPU clock 1229A. Accordingly, the phase of CPU outputs are effectively unchanged, even though the phase of CPU clock 1229B for CPU inputs has been pulled back by Δt 1202A in accordance with the teachings of the present invention.

In the foregoing detailed description, the method and apparatus of the present invention have been described with reference to exemplary embodiments thereof. It will, however, be evident that there is modifications and changes thereto without departing from the broader spirit and scope of the present invention. The present specification are accordingly to be regarded as illustrative rather than restrictive.

What is claimed is:

1. An apparatus, comprising:
   a phase adjustment circuit coupled to receive a system clock and phase control information, the phase adjustment circuit to generate a first input/output (I/O) clock having a selectable phase difference from the system clock, the phase adjustment circuit including a first delay circuit coupled to receive the system clock and coupled to delay the system clock in response to the phase control information; and
   an I/O buffer circuit clocked in response to the first I/O clock to latch I/O data of the apparatus, the I/O buffer circuit coupled to latch the I/O data to and from a remote I/O buffer circuit of a remote apparatus, the remote I/O buffer circuit clocked in response to a remote I/O clock substantially in phase with the system clock.

2. The apparatus of claim 1 wherein the phase adjustment circuit further comprises:
   a first phase locked loop circuit to generate the first I/O clock, the first delay circuit coupled to a reference clock input of the first phase locked loop circuit; and
   a second delay circuit coupled to a feedback clock input of the first phase locked loop circuit, the second delay circuit coupled to receive the first I/O clock and coupled to delay the first I/O clock in response to the phase control information.

3. The apparatus of claim 2 wherein the phase control information comprises:
  a first delay control signal coupled to be received by the first delay circuit; and
  a second delay control signal coupled be received by the second delay circuit.

4. The apparatus of claim 1 wherein the I/O buffer circuit includes a third delay circuit coupled in an I/O data path of the I/O buffer circuit, the third delay circuit coupled to receive a third delay control signal, the third delay circuit coupled to delay an I/O data of the I/O buffer circuit in response to the third delay control signal.

5. The apparatus of claim 4 wherein the I/O data path comprises an output data path of the I/O buffer circuit including an output buffer and an output data latch clocked in response to the first I/O clock.

6. The apparatus of claim 4 wherein the I/O data path comprises an input data path of the I/O buffer circuit including an input buffer and an input data latch clocked in response to the first I/O clock.

7. The apparatus of claim 2 wherein at least the first I/O clock has a clock period of T, wherein at least one of the first and second delay circuits is included in a delayed lock loop (DLL) circuit, wherein at least one of the first and second delay circuits comprises:
  a first delay chain circuit coupled to receive a first signal, the first delay chain circuit including a chain of at least N outputs, each successive one of the chain N outputs coupled to output the first signal with an additional $(1/N) \times T$ delay relative to a neighboring upstream output of the chain of N outputs;
  a first selection circuit coupled to receive the chain of at least N outputs of the first delay chain circuit, the first selection circuit coupled to select at least one of the chain of at least N outputs in response to a delay control signal generate an output of said one of the first and second delay circuits.

8. The apparatus of claim 7 wherein said one of the first and second delay circuits further comprises an interpolator circuit coupled to receive a pair of the at least N outputs of the first delay chain circuit from the first selection circuit, the interpolator circuit coupled to generate said output of said one of the first and second delay circuits responsive to the delay control signal.

9. The apparatus of claim 7 wherein the DLL further comprises calibration circuitry coupled to receive the first signal and coupled to the first delay chain circuit and coupled to calibrate the first delay chain circuit.

10. The apparatus of claim 9 wherein the calibration circuitry comprises:
  a phase detector coupled to receive the first signal and coupled to receive a delayed first signal from an Nth one of the chain of at least N outputs of the first delay chain circuit;
  an up/down counter coupled to an output of the phase detector; and
  a calibration controller coupled to receive a calibration control signal from the up/down counter and coupled to generate a calibration bias information coupled to be received by the first delay chain circuit.

11. The apparatus of claim 7 wherein the first delay chain circuit comprises a chain of at least N variable resistor-capacitor (RC) circuits coupled in series to output the chain of at least N outputs of the first delay chain circuit.

12. The apparatus of claim 4 wherein the third delay circuit comprises:
  a second delay chain circuit coupled to receive an input signal, the second delay chain circuit including a chain of a plurality of outputs, each successive one of the chain of the plurality of outputs coupled to output a delayed input signal with an additional incremental delay relative to a neighboring upstream output of the chain of the plurality of outputs;
  a second selection circuit coupled to receive the chain of the plurality of outputs of the second delay chain circuit, the second selection circuit coupled to select at least one of the chain of the plurality of outputs in response to the third delay control signal, wherein a delayed output signal is generated in response to the selected at least one of the chain of the plurality of outputs of the second delay chain circuit.

13. The apparatus of claim 12 further comprising a second interpolator circuit coupled to receive a pair of the plurality of outputs of the second delay chain circuit from the second selection circuit, the second interpolator circuit coupled to output the delayed output signal responsive to the third delay control signal.

14. The apparatus of claim 12 wherein the second delay chain circuit is coupled to receive calibration bias information from a calibration circuit to calibrate the second delay chain circuit.

15. A system, comprising:
  a clock driver circuit coupled to generate a system clock;
  a first chip including a first input/output (I/O) buffer circuit and a first phase locked loop circuit coupled receive the system clock and coupled to generate a first I/O clock coupled to clock the first I/O buffer circuit, the first I/O clock substantially in phase with the system clock; and
  a second chip including a second I/O buffer circuit coupled to the first I/O buffer circuit to transfer I/O data between the first and second chips, the second chip including a phase adjustment circuit coupled receive the system clock and coupled to generate a second I/O clock coupled to clock the second I/O buffer circuit, the second I/O clock having a selectable phase difference from the system clock.

16. The system of claim 15 wherein the second chip further includes a delay circuit in an I/O data path of the second I/O buffer circuit, the delay circuit coupled to receive a delay control signal, the delay circuit coupled to delay an I/O data transfer between the first and second chips in response to the delay control signal.

17. The system of claim 16 wherein the delay circuit is responsive to a calibration controller responsive to a counter output to provide the delay of the I/O data transfer substantially independent of process-voltage-temperature variations.

18. The system of claim 15 wherein the phase adjustment circuit comprises:
  a phase locked loop circuit coupled to generate second I/O clock;
  a forward delay circuit coupled to a reference clock input of the phase locked loop circuit and coupled to receive the system clock, the forward delay circuit coupled to delay the reference clock input from receiving the system clock in response to a forward delay control signal; and
  a feedback delay circuit coupled to a feedback clock input of the phase locked loop circuit and coupled to receive the second I/O clock, the feedback delay circuit coupled to delay the feedback clock input from receiving the second I/O clock in response to a feedback delay control signal.

19. The system of claim 18 wherein both the forward and feedback delay circuits are responsive to a calibration controller responsive to a counter output to provide the delay of respective clock signals substantially independent of process-voltage-temperature variations.

20. The system of claim 18 wherein at least one of the forward and feedback delay circuits is included in a delay locked loop (DLL) circuit having a counter coupled to an output of a phase detector, the phase detector coupled to detect a phase difference between an oscillating signal and a delayed oscillating signal, the delayed oscillating signal generated by a delay chain circuit coupled to delay the oscillating signal by at least one period of the oscillating signal.

21. A method, comprising:
generating a first input/output (I/O) clock in response to a system clock to clock a first I/O buffer of a first chip;
adjusting a phase of the first I/O clock to be out of phase with the system clock;
transmitting I/O data between the first I/O buffer of the first chip and a second I/O buffer of a second chip, the second I/O buffer clocked in response to a second I/O clock substantially in phase with the system clock; and
adjusting a delay of an I/O data path of the first I/O buffer of the first chip such that the transmission of I/O data through the I/O data path of the first I/O buffer is out of phase with the first I/O clock.

22. The method of claim 21 further comprising calibrating delay circuitry with respect to the system clock.

23. The method of claim 22 wherein calibrating the delay circuitry comprises:
delaying the system clock at least one half clock period with the delay circuitry;
measuring a phase difference between the system clock and the delayed system clock; and
adjusting the delay circuitry such that transitions of the delayed system clock are substantially aligned with transitions of the system clock.

24. The method of claim 21 wherein the I/O data path of the first I/O buffer comprises an output data path of the first I/O buffer.

25. The method of claim 21 wherein the I/O data path of the first I/O buffer comprises an input data path of the first I/O buffer.

26. The method of claim 21 further comprising testing for an I/O timing defect in a system including the first and second chips by adjusting the phase of the first I/O clock to be out of phase with the system clock and transmitting the I/O data between the first and second I/O buffers until there is an I/O data transmission failure.

27. The method of claim 21 further comprising overcoming an I/O timing defect in a system including the first and second chips by adjusting the phase of the first I/O clock to be out of phase with the system clock until there is a successful I/O data transmission between the first and second chips.

28. An apparatus, comprising:
means for generating a first input/output (I/O) clock in response to a system clock and phase control information, the first I/O clock out of phase from the system clock by a selectable phase difference, the means for generating the first I/O clock including;
first phase locked loop means for generating the first I/O clock; and
first delay means coupled to a reference clock input of the first phase locked loop means and coupled to receive the system clock, the first delay means for delaying the system clock in response to the phase control information; and
means for latching I/O data clocked in response to the first I/O clock, the means for latching I/O data coupled to remote means for latching I/O data clocked in response to a second I/O clock substantially in phase with the system clock.

29. The apparatus of claim 28 wherein the means for generating the first I/O clock further includes:
second delay means coupled to a feedback clock input of the first phase locked loop means and coupled to receive the first I/O clock, the second delay means for delaying the first I/O clock in response to the phase control information.

* * * * *